United States Patent [19]

Razeghi

[11] Patent Number: 5,831,277
[45] Date of Patent: Nov. 3, 1998

[54] III-NITRIDE SUPERLATTICE STRUCTURES

[75] Inventor: Manijeh Razeghi, Wilmette, Ill.

[73] Assignee: Northwestern University, Evanston, Ill.

[21] Appl. No.: 820,586

[22] Filed: Mar. 19, 1997

[51] Int. Cl.⁶ .................................................. H01L 29/06
[52] U.S. Cl. .............................. 257/15; 257/17; 257/18; 257/22; 257/96; 257/103
[58] Field of Search ................................. 257/15, 17, 18, 257/22, 96, 97, 102, 103

[56] References Cited

U.S. PATENT DOCUMENTS 5,670,798  9/1997  Schetzina .................................. 257/96

Primary Examiner—Minh Loan Tran
Attorney, Agent, or Firm—Welsh & Katz, Ltd.

[57] ABSTRACT

The subject invention involves the p-type doping of $Al_xGa_{1-x}N$ thin films with a III-nitride composition and specifically a $\{Al_xGa_{1-x}N/GaN\}$ short-period superlattice structure of less than 5000 Å thickness in total in which both the barriers and the wells are p-type doped with Mg.

20 Claims, 1 Drawing Sheet

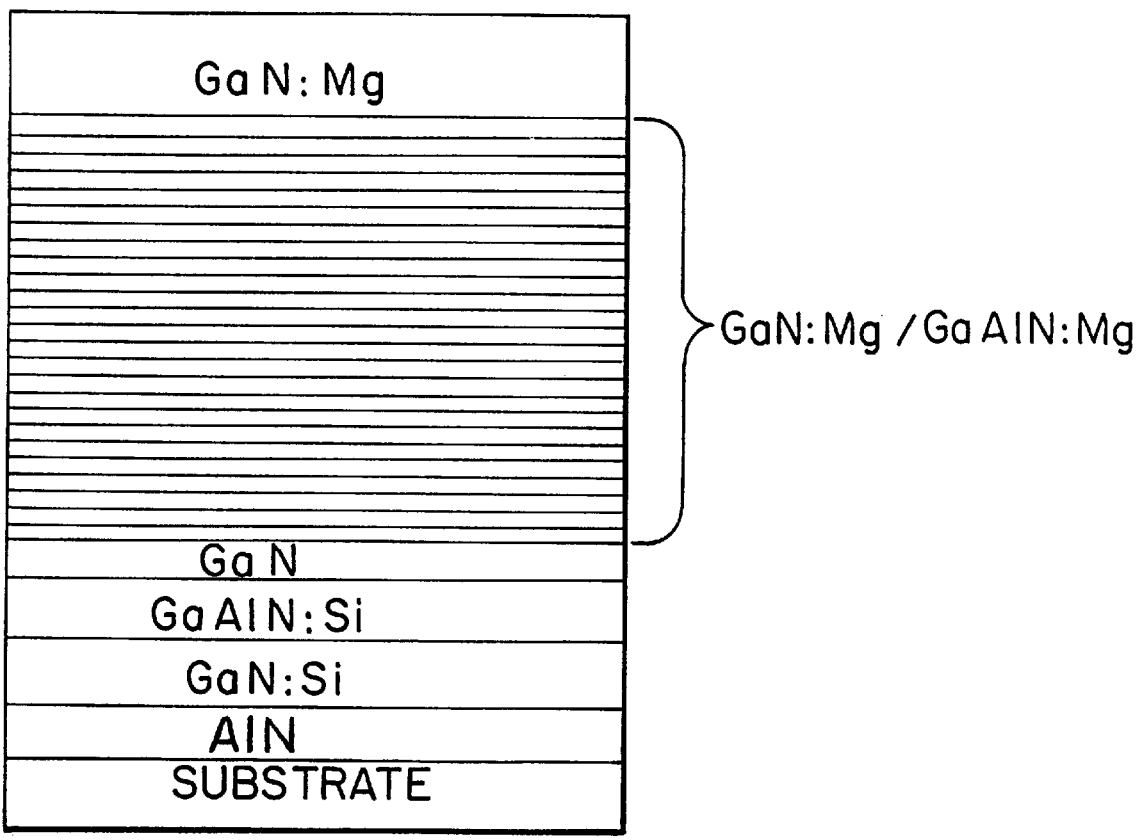

III-NITRIDE SUPERLATTICE STRUCTURES

This invention is made with government support under Grant BMDO/ONR-N-00014-93-1-409 and DARPA/ONR-N-00014-96-1-0214. The government has certain rights in the invention.

FIELD OF THE INVENTION

This invention relates to semiconductor III-V alloy superlattice structures, as well as to a method of making III-V alloy superlattice structures for use in photonic and optoelectronic devices.

BACKGROUND OF THE INVENTION

The importance of semiconductor emitters and detectors is rapidly increasing along with progress in the optoelectronic field, such as optical fiber communication, optical data processing, storage and solid state laser pumping.

III-nitride-based compounds, especially $Al_xGa_{1-x}N$ alloys appear to be a most promising material system for high performance and economical ultraviolet (UV) emitters photodetectors. With a bandgap energy from 3.4 eV to 6.2 eV, UV photodetectors with cut-off wavelengths from 200 nm (AlN) to 365 nm (GaN) can be fabricated from this alloy system. The direct bandgap of $Al_xGa_{1-x}N$-based detectors are also expected to have better intrinsic solar blindness than any other UV photodetectors. This makes them ideal for many applications, such as the surveillance and recognition of spacecraft, space-to-space communications, the monitoring of welding, as well as engines, combustion chambers, and astronomical physics.

Further, AlN, GaN, InN and their alloys (III-Nitrides) have direct bandgap energies from 1.9 eV (659 nm) to 6.2 eV (200 nm, which cover almost the whole visible spectrum down to mid-ultraviolet wavelength range. Therefore, one of the most important applications of these materials is to make visible and ultraviolet light-emitting diodes (LED), laser diodes (LD) and photodetectors with high quantum efficiency, which are immediately needed in the current commercial markets and can be best achieved by these materials.

In device structures, $Al_xGa_{1-x}N$ can be used as both the n- and p-type confinement layers, while GaN and InN may be used as the active layers. In general, by increasing the Al concentration in $Al_xGa_{1-x}N$, better electrical and optical confinement can be achieved. However, the n- and p-type conductivity of the ternary alloys dramatically decreases with more Al in the alloy. Thus, $Al_xGa_{1-x}N$ has a high energy gap, but poor doping levels. GaN, on the other hand, has good doping levels, but a poor energy gap. For example, doping $Al_xGa_{1-x}N$ p-type has been unsuccessful in the past because the doping impurities such as Mg or Zn, only introduce deep levels in $Al_xGa_{1-x}N$, resulting in high activation energies.

SUMMARY OF THE INVENTION

An object, therefore, of the subject invention is a III-Nitride alloy superlattice for use in photoconductors and diodes having high quantum efficiency.

A further object of the subject invention is a $Al_xGa_{1-x}N$/GaN-based composition in a superlattice structure of high quality.

A still further object of the subject invention is an alloy of the composition $Al_xGa_{1-x}N$ in a superlattice structure with a high energy gap, as well as high dopant levels.

These and other objects are attained by the subject invention wherein there is achieved the p-type doping of $Al_xGa_{1-x}N$ thin films for high Al concentrations by using a III-nitride composition and specifically a $\{Al_xGa_{1-x}N/GaN\}$ short-period superlattice structure of less than 5000 Å thickness in total in which both the barriers and the wells are p-type doped with Mg.

The performance of electronic devices, such as HEMT, HBT, MOSFET, MESFET, Schottky diodes and optoelectric devices such as laser diodes, LEDs, photodetectors, waveguides and switches may be enhanced through the use of modulation doped heterostructures by doping the barrier layer while leaving active layers undoped. The enhancement of the electron mobility is disclosed herein through the use of an $Al_xGa_{1-x}N$/GaN heterostructure. In using doped p-type $Ga_xAl_{1-x}N$ confinement layer of devices, a superlattice of $GaN/Ga_xAl_{1-x}N$ controls the p-type concentration in $Ga_xAl_{1-x}N$ layers. To do this, an undoped semi-insulating GaN film is grown, followed by a few Å thick undoped $Al_xGa_{1-x}N$ spacers and then a few hundred Å thick ternary barrier layer ($0 \leq x \leq 1.0$) doped with Si or Ge ($N_D$-$N_A$~$10^{17}$ cm$^{-3}$). Electron mobilities of ~1000 cm$^2$/Vs at room temperature and higher than 2000 cm$^2$/Vs at 77 K have been measured after varying thickness, doping level of the $Al_xGa_{1-x}N$ barrier layer and the thickness of the spacer.

DESCRIPTION OF THE DRAWING

The FIGURE is a cross-section of a III-Nitride based diode structure according to the subject invention.

DETAILED DESCRIPTION OF THE INVENTION

The reactor and associated gas-distribution scheme used herein are substantially as described in U.S. Pat. No. 5,384,151. The system comprises a cooled quartz reaction tube (diameter 5 cm in the substrate area) pumped by a high-capacity roughing pump (120 hr$^{-1}$) to a vacuum between 10 and 300 Torr. The substrate was mounted on a pyrolytically coated graphite susceptor that was heated by rf induction. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes and Swagelock fittings. Flow rates were controlled by mass flowmeters.

The reactor was purged with a hydrogen flow of 4 liters min$^{-1}$, and the working pressure of 78 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure. The pressure in the gas panel was regulated by the needle valve placed between the gas panel and the reactor. The needle valve was adjusted to maintain a constant pressure of 1 atm on the gas panel, thereby ensuring reproducibility of flow-rate measurements.

The gas sources used in this study for the growth of AlGaN by LP-MOCVD are listed below.

| Group-III Sources | Group-V Source |
|---|---|
| $In(CH_3)_3$ | $NH_3$ |
| $In(C_2H_5)_3$ | |
| $Al(CH_3)_3$ | |
| $Al(C_2H_5)_3$ | |
| $Ga(CH_3)_3$ | |
| $Ga(C_2H_5)_3$ | |

An accurately metered flow of purified $H_2$ for TMI is passed through the appropriate bubbler. To ensure that the source material remains in vapor form, the saturated vapor that emerges from the bottle is immediately diluted by a flow of hydrogen. The mole fraction, and thus the partial pressure, of the source species is lower in the mixture and is prevented from condensing in the stainless steel pipe work.

Pure or diluted ammonia ($NH_3$) is used as a source of N. The metal alkyl or hydride flow can be either injected into the reactor or into the waste line by using two-way valves. In each case, the source flow is first switched into the waste line to establish the flow rate and then switched into the reactor. The total gas flow rate is 8 liters min$^{-1}$ during growth. Stable flows are achieved by the use of mass flow controllers.

Exemplary dopants which may be used in the method of the subject invention are as follows:

| n dopant | p dopant |
|---|---|
| $H_2Se$ | $(CH_3)_2Zn$ |
| $H_2S$ $GeH_4$ | $(C_2H_5)_2$ $Zn$ |
| $(CH_3)_3Sn$ | $(C_2H_5)_2$ $Be$ |
| $(C_2H_5)_3Sn$ | $(CH_3)_2Cd$ |
| $SiH_4$ | $(\eta C_2H_5)_2Mg$ |
| $Si_2H_6$ | |

The substrate can be GaAs, Si, $Al_2O_3$, MgO, SiC, ZnO, $LiGaO_2$, $LiAlO_2$, $MgAl_2O_4$ or GaN. Preferably, sapphire ($Al_2O_3$) is used as the substrate. The epitaxial layer quality is sensitive to the pretreatment of the substrate and the alloy composition. Pretreatment of the substrates prior to epitaxial growth was thus found to be beneficial. One such pretreatment procedure is as follows:

1. Dipping in $H_2SO_4$ for 3 minutes with ultrasonic agitation;
2. Rinsing in Deionized $H_2O$;
3. Rinsing in hot methanol;
4. Dipping in 3% Br in methanol at room temperature for 3 minutes (ultrasonic bath);
5. Rinsing in hot methanol;
6. Dipping in $H_2SO_4$ for 3 minutes;
7. Rinsing in deionized $H_2O$, and
8. Rinsing in hot methanol.

After this treatment, it is possible to preserve the substrate for one or two weeks without repeating this treatment prior to growth.

The invention is described in accordance with the drawings and, in particular, with respect to the FIGURE. The FIGURE is a cross-section of a III-Nitride based laser diode structure formed in accordance with the subject invention for use on a photo emitter.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species, but is relatively independent of temperature between 700° and 1000° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

For best results, all surfaces of the growth reaction chamber are coated with a barrier coating capable of withstanding high temperatures and not reacting with the reactants and dopants utilized therein at such high temperatures. Preferably, a coating of AlN or of SiC is grown in situ in the reaction chamber to cover all surfaces therein. There is thus formed a stable layer that prevents oxygen and other impurities originating within the reaction chamber from reacting with the semiconducting layer to be grown.

In order to increase the mobility of electrons, thus enhancing the performance of electronic devices, such as HEMT and MODFET, modulation doped heterostructures can be used by doping the barrier layer while leaving the well layer undoped. The electron mobility may be enhanced by using the $Al_xGa_{1-x}N$/GaN heterostructure of the subject invention. First, an undoped semi-insulating GaN film is grown, followed by a few Å thick undoped $Al_xGa_{1-x}N$ spacers and then a few hundred Å thick ternary barrier layer ($0 \leq x \leq 1.0$, preferably, $0.1 \leq x \leq 0.7$) doped with Si or Ge ($N_D$-$N_A \sim 10^{17}$ cm$^{-3}$). Electron mobilities of ~1000 cm$^2$/Vs at room temperature and higher than 2000 cm$^2$/Vs at 77K as measured and optimized after varying thickness, doping level of the $Al_xGa_{1-x}N$ barrier layer and the thickness of the spacer.

More specifically, high quality AlGaN/GaN may be grown in the method of the subject invention by low pressure metalorganic chemical vapor deposition (LP-MOCVD). MBE, MOCVD, LPE, VPE, CBE, ALE and MEE are all processes which are well known and may be used in the subject invention. The layers of the heterostructure are grown by an induction-heated horizontal cool wall reactor. Trimethylindium (TMI), Trimethylaluminum (TmAl) and Triethylgallium (TEG) are used as the sources of Aluminum, Indium and Gallium. Pure and diluted ammonium gas ($NH_3$) is used as the N source. Sample is grown on a sapphire substrate. A buffer layer of AlN and contact and n-doped confinement layers of GaN (5000 Å) and $Al_xGa_{1-x}N$ (5000 Å) (X=0→1) are individually laid on the substrate. $Ga_yIn_{1-y}N$ ($0 \leq y \leq 1$) may be substituted for $Al_xGa_{1-x}N$ in the confinement and active layers. The undoped active layer may be GaN or $In_xGa_{1-x}N$ (X=0→1). The superlattice is grown by alternating GaN (0.25–30 Å) with $Al_xGa_{1-x}N$ ($0 \leq x \leq 1.0$) (0.5–1.0 Å) to a total thickness of less than 5000 Å and preferably from 2 Å–5000 Å. 4–500 total layers may be grown as a part of the superlattice. Preferably X=0.3. Layers in the superlattice are doped (p-type, preferably Mg) to a $10^{17}$ cm$^{-3}$ level. The optimum growth conditions for the respective layers are listed in Table 1. The confinement of the active layer for the subject invention may be as a heterostructure, separate confinement heterostructures or with a quantum well.

Doping is preferably conducted with bis-cyclopentadienyl magnesium $CP_2Mg$ for p-type doping. Silane ($SiH_4$) is preferred for n-type doping. Doping is performed through a $CP_2Mg$ bubbler with $H_2$ as carrier gas and at temperatures from −15° C. to ambient temperatures at 20–90 cm$^3$ min.$^{-1}$. $SiH_4$ may be simply directed at ambient temperatures onto the hot substrate at 20–90 cm$^3$ min.$^{-1}$.

TABLE 1

Optimum growth conditions of a $Al_xGa_{1-x}N/In_xGa_{1-x}N$ structure.

| | AlGaN | InGaN | GaN |
|---|---|---|---|
| Growth Pressure | 76 | 76 | 76 |
| Growth Temperature (°C.) | 800–1000 | 700–800 | 800–1000 |
| Total $H_2$ Flow (liter/min) | 3 | 3 | 3 |
| $Al(C_2H_5)$ | 30 | — | — |
| TMI (cc/min) | — | 200 | — |
| TEG (cc/min) | 120 | 120 | 120 |
| $NH_3$ (cc/min) | 300 | 300 | 300 |
| Growth Rate (Å/min) | 100 | 100 | 100 |

EXAMPLE 1

A III-Nitride based superlattice structure as set forth in FIG. 1 is prepared. After coating the reaction chamber with AlN at a temperature of 100° C., a thin (300 Å) AlN buffer layer is first grown on a sapphire substrate prepared as set forth above. A contact layer of GaN (5000 Å) is next grown and doped with silicon to a concentration of $5 \times 10^{17}$ atoms $cm^{-3}$. An n-type confinement layer of $Al_{0.7}Ga_{0.3}N$ (5000 Å) is next grown and doped with silicon, to a concentration of $5 \times 10^{17}$ atoms $cm^{-3}$. An active layer of GaN (20 Å) is next grown, all doped with silicon. A superlattice of 10 successive confinement layers of a 10 Å thickness of GaN and a 100 Å thickness $Al_{0.7}Ga_{0.3}N$ is grown and doped with Mg for a total thickness of about 1000 Å. The magnesium doped layers are annealed at a temperature of about 700° C. After annealing, the hole concentration is $2 \times 10^{17}$ $cm^{-3}$. A cap or contact layer of GaN (200 Å) highly doped with silicon magnesium as set forth above, i.e. to a concentration of $10^{20}$ atoms/$cm^3$ is grown. The n-contact is formed by deposition of Ti/Au, while the p-contact is formed by deposition of Ni/Ti and annealing at 450° C. for 30 s. The superlattice structure is then functional.

EXAMPLE 2

A III-Nitride based laser diode structure as set forth in Example 1 is prepared. All compositions are identical except InGaN is the active layer. Similar results are attained as in Example 1.

The structures of Examples 1 and 2 show enhancement of electron mobility by providing a method of increasing doping levels on hard to dope materials, thereby yielding good conduction at both the n and p contact points. The high doping levels provides a p-layer with higher conductivity.

In a comparison of the conductivity of a short period superlattice structure, according to the subject invention, and a conventional thickness of $Al_{0.1}Ga_{0.9}N$:Mg, the short period superlattice structure was markably lower in resistivity: 225 alternating layers of $Al_{0.3}Ga_{0.7}N$:Mg/GaN:Mg (total thickness 0.7 μm) had a resistivity of 7 Ω. cm; 0.7 μm of $Al_{0.1}Ga_{0.9}N$:Mg had a resistivity of 63 Ω. cm.

Examples 1 and 2 demonstrate the high p-type doping of GaN thin films with resistivities lower than 2 Ω. cm. Thus, the subject invention achieves a p-type doping of $Al_xGa_{1-x}N$ thin films for high Al concentrations, by using a $\{Al_xGa_{1-x}N/GaN\}$ short-period superlattice structure in which both the barriers and the wells are p-typed doped with Mg. A superlattice is known to exhibit minibands due to the coupling between the very closely spaced wells. Therefore, the superlattice is equivalent in properties to an $Al_xGa_{1-x}N$ alloy whose composition is determined by the ternary composition in a $\{Al_xGa_{1-x}N/GaN\}$ period and by the relative thicknesses of the barriers and the wells. Moreover, the dopant level will be shallower relative to the minibands rather than relative to the valence band of the bulk ternary material. As a result, more dopant impurities will be ionized and more holes created. Furthermore, because the barrier layers are very thin, the holes can very easily tunnel through the whole structure. Both of these phenomena result in a lower activation energy and higher p-type conductivity than in bulk or single layer $Al_xGa_{1-x}N$.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

What is claimed is:

1. A photoemitter device, comprising a substrate, an upper and lower contact layer, an upper and lower confinement layer, an undoped active layer between said upper and lower confinement layer and a cap layer;

said upper confinement layer comprising a superlattice structure having from about 5 to about 500 alternating layers of $Al_xGa_{1-x}N$ and GaN ($0 \leq X \leq 1$) with a total thickness of less than 5000 Å, and said lower confinement layer consisting essentially of one GaN layer and one $Ga_xAl_{1-x}N$ layer.

2. The device of claim 1 wherein said substrate is $Al_2O_3$ or SiC.

3. The device of claim 1 wherein said lower contact layer is GaN:Si.

4. The device of claim 1 wherein said lower contact layer is doped with a dopant selected from the group consisting of Si, Ge and Sn.

5. The device of claim 1 wherein said active layer is GaN or InGaN.

6. The device of claim 1 wherein the layers of GaN of said upper confinement layer each have a thickness of between about 10 to about 30 Å and p-type doping of $\geq 2 \times 10^{17}$ $cm^{-3}$.

7. The device of claim 1 wherein the layers of $Al_xGa_{1-x}N$ of said upper confinement layers have a thickness of about 10 to about 100 Å and p-type doping of $\geq 2 \times 10^{17}$ $cm^{-3}$.

8. The device of claim 1 wherein the layers of $Al_xGa_{1-x}N$ of said upper confinement layers have a thickness of about 10 to about 100 Å.

9. The device of claim 1 wherein said upper confinement layers are doped with a p-type dopant.

10. The device of claim 1 wherein said upper confinement layers are doped with Mg, Be, Zn or Cd.

11. A photoemitter device, comprising a substrate, an upper and lower contact layer, an upper and lower confinement layer, an undoped active layer between said upper and lower confinement layer and a cap layer;

said upper confinement layer comprising a superlattice structure having from about 5 to about 500 alternating layers of $Al_xGa_{1-x}N$ and GaN ($0 \leq X \leq 1$) with a total thickness of less than 5000 Å, and said layers of GaN in said superlattice structure each being of substantially equal thickness.

12. The device of claim 11 wherein said substrate is $Al_2O_3$ or SiC.

13. The device of claim 11 wherein said lower contact layer is GaN:Si.

14. The device of claim 11 wherein said lower contact layer is doped with a dopant selected from the group consisting of Si, Ge and Sn.

15. The device of claim 11 wherein said active layer is GaN or InGaN.

16. The device of claim 11 wherein the layers of GaN of said upper confinement layers have a thickness of between about 10 to about 30 Å and p-type doping of $\geq 2\times 10^{17}$ $cm^{-3}$.

17. The device of claim 11 wherein the layers of $Al_xGa_{1-x}N$ of said upper confinement layer have a thickness of about 10 to about 100 Å and p-type doping of $\geq 2\times 10^{17}$ $cm^{-3}$.

18. The device of claim 11 wherein the layers of $Al_xGa_{1-x}N$ of said upper confinement layer have a thickness of about 10 to about 100 Å.

19. The device of claim 11 wherein said upper confinement layer is doped with a p-type dopant.

20. The device of claim 11 wherein said upper confinement layer is doped with Mg, Be, Zn or Cd.

* * * * *